United States Patent [19]

Inuzima et al.

[11] Patent Number: 4,950,624
[45] Date of Patent: Aug. 21, 1990

[54] METHOD OF DEPOSITING FILMS USING PHOTO-CVD WITH CHAMBER PLASMA CLEANING

[75] Inventors: Takashi Inuzima; Shigenori Hayashi; Toru Takayama, all of Atsugi; Seiichi Odaka, Akita; Naoki Hirose, Atsugi, all of Japan

[73] Assignee: Semiconductor Energy Laboratory Co., Ltd., Atsugi, Japan

[21] Appl. No.: 194,206

[22] Filed: May 16, 1988

Related U.S. Application Data

[62] Division of Ser. No. 91,770, Sep. 1, 1987, abandoned.

[30] Foreign Application Priority Data

| Sep. 9, 1986 | [JP] | Japan | 61-2118823 |
| Sep. 9, 1986 | [JP] | Japan | 61-213324 |
| Sep. 9, 1986 | [JP] | Japan | 61-213325 |
| Jun. 5, 1987 | [JP] | Japan | 62-141050 |

[51] Int. Cl.$^5$ .......................................... H01L 21/469
[52] U.S. Cl. ........................... 437/235; 148/DIG. 17; 148/DIG. 43; 148/DIG. 45; 427/53.1; 437/170; 437/173; 437/238; 437/241; 437/978; 437/925
[58] Field of Search ............ 148/DIG. 1, 25, 17, 148/43, 45, 51, 71, 118, 114; 118/723, 50.1, 620; 204/192.12, 192.23; 427/38, 39, 53.1, 54.1, 55; 437/18, 19, 4, 2, 3, 101, 170, 171, 172, 173, 235, 238, 239, 978, 942, 241, 925

[56] References Cited

U.S. PATENT DOCUMENTS

| 4,015,558 | 4/1977 | Small et al. | 118/620 |
| 4,495,218 | 1/1985 | Azuma et al. | 437/238 |
| 4,529,474 | 7/1985 | Fujiyma | 427/38 |
| 4,546,535 | 10/1985 | Shepard | 437/228 |
| 4,579,609 | 4/1986 | Reif et al. | 437/171 |
| 4,597,986 | 7/1986 | Scapple et al. | 427/53.1 |
| 4,601,260 | 7/1986 | Ovshinsky | 118/50.1 |
| 4,612,207 | 9/1986 | Jansen | 118/723 |
| 4,636,401 | 1/1989 | Yamazaki et al. | 437/170 |
| 4,657,616 | 4/1987 | Benzing et al. | 118/620 |
| 4,705,912 | 11/1987 | Nakashima et al. | 437/101 |
| 4,709,655 | 12/1987 | Van Mastrigt | 118/50.1 |
| 4,719,123 | 1/1988 | Haku et al. | 437/101 |
| 4,735,822 | 4/1988 | Ohtoshi et al. | 437/4 |
| 4,766,091 | 8/1988 | Ohtoshi et al. | 437/101 |
| 4,772,570 | 9/1988 | Kanai et al. | 437/101 |
| 4,796,562 | 1/1989 | Brors et al. | 118/50.1 |
| 4,808,553 | 2/1989 | Yamazaki | 437/100 |
| 4,810,673 | 3/1989 | Freeman | 437/238 |
| 4,848,272 | 7/1989 | Ohmura et al. | 118/50.1 |
| 4,857,139 | 8/1989 | Tashiro et al. | 118/50.1 |

FOREIGN PATENT DOCUMENTS

| 0075183 | 6/1977 | Japan | 437/170 |
| 0197856 | 11/1983 | Japan | 437/978 |
| 0145628 | 8/1985 | Japan | 437/978 |
| 0167318 | 8/1985 | Japan | 118/723 |
| 1110772 | 5/1986 | Japan | 118/719 |
| 0289649 | 12/1986 | Japan | 437/978 |
| 0216318 | 2/1987 | Japan . | |
| 0314828 | 4/1989 | Japan . | |

*Primary Examiner*—Olik Chaudhuri
*Assistant Examiner*—William D. Bunch
*Attorney, Agent, or Firm*—Sixbey, Friedman, Leedom & Ferguson

[57] ABSTRACT

An improved CVD apparatus for depositing a uniform film is shown. The apparatus comprises a reaction chamber, a substrate holder and a plurality of light source for photo CVD or a pair of electrode for plasma CVD. The substrate holder is a cylindrical cart which is encircled by the light sources, and which is rotated around its axis by a driving device. With this configuration, the substrates mounted on the cart and the surroundings can be energized by light or plasma evenly throughout the surfaces to be coated.

6 Claims, 8 Drawing Sheets

METHOD OF DEPOSITING FILMS USING PHOTO-CVD WITH CHAMBER PLASMA CLEANING

This application is a division of Ser. No. 07/091,770, filed Sept. 1, 1987, now abandoned.

BACKGROUND OF THE INVENTION

This invention relates to a photo enhanced CVD apparatus.

There are used many chemical vapor deposition (CVD) processes such as APCVD, LP CVD, plasma CVD, thermal CVD and so forth for depositing a film on a substrate. While these processes have their own peculiar characteristics respectively, the temperature at which each process is carried out is commonly rather high. Such high temperature process is not suitable for formation of passivation film on an aluminium electrode arrangement.

Photo enhanced CVD process has attracted the interest of artisans because it can be carried out at a comparatively low temperature. This process is based on the energy of light, namely an optical reaction is carried out. For example, in the case of photo CVD process using silane and ammonia, mercury atoms are excited by irradiation of ultraviolet light with 2,537Å in wavelength. The process is carried out to deposit a silicon nitride film on a substrate in accordance with the following equation:

$Hg + h\nu \rightarrow Hg^*$ ("*" is a symbol for excitation)

$Hg^* + SiH_4 \rightarrow SiH_3 + H- + Hg$ ("−" is a symbol for radical)

$Hg^* + NH_3 \rightarrow NH_2- + H- + Hg$ $yNH_2- + xSiH_3- \rightarrow Si_xN_y + zH_2$ In the above equations, x, y and z are chosen appropriately.

FIG. 1 is a cross section view showing a photo CVD apparatus which has been devised by the inventors in advance of the present invention. To facilitate the understanding of the background of the present ingvention, this apparatus will be briefly explained. In the figure, the apparatus comprises a reaction chamber 31, light source chambers 39 and ultraviolet light sources 41. Between the light source chambers 39, a cart 35, is mounted so as to be capable of moving in the direction perpendicular to the drawing sheet. The cart is provided with heaters 37 to heat substrates mounted on the external surfaces of the cart 35 facing to the light source chambers 39. The temperature of the substrates 33 is elevated to about 200° C. which is suitable for forming a silicon nitride film. In the reaction chamber 31 is circulated a process gas at a pressure of several Torrs. The process gas is irradiated through a quartz windows 47 with light radiated from the light source 41. A numeral 45 designates electrodes by virtue of which discharge takes place with the cart as the other electrode and undesired product deposited on the surface of the quartz windows 47 can be eliminated by spattering.

However, with this apparatus, the thickness of deposited film depends on the spacial relationship between the light sources and the position of the substrates. Namely, the product of the CVD process may be deposited with a greater thickness at the position irradiated with stronger light. Generally speaking, the tolerable fluctuation of the thickness of the film is about 10%. Furthermore, the quartz windows 47 have to be thick to bear the differential pressure between the inside of the rection chamber 31 and the light source chamber 39 in which cooling gas is circulated. The differential pressure may cause leakage of the cooling gas from the light source chamber 39 into the reaction chamber 31. As an alternative, a particular cooling syustem may be provided for the light source chamber so that the pressure in the light source chamber, and therefore the differentail pressure, can be decreased. Also, when discharge between the cart 35 and the reaction chamber 31 is desired to remove unnecessary film deposited on the light window by sputtering, the discharge tends to deviate from the window. Because of this, the particular electrodes 45 have to be provided which makes the size of the apparatus large.

As to unevenness of film deposited by CVD, it is also the problem in the case of plasma CVD. The energy of plasma seems dependent on the relationship between the substrate and a pair of electrodes for discharge. So a uniform deposition condition on a substrate to be coated is also demanded for plasma CVD.

SUMMARY OF THE INVENTION

It is therefore an object of the invention to provide an CVD apparatus with which a film can be deposited with a uniform thickness.

It is another object of the invention to provide an CVD apparatus with which a film can be deposited with high quality.

It is a further object of the invention to provide a cheaper CVD apparatus.

It is a still further object of the invention to provide a compact CVD apparatus.

DETAILED DESCRIPTION OF THE PREFERRED EMBODIMENTS

Figure 1:
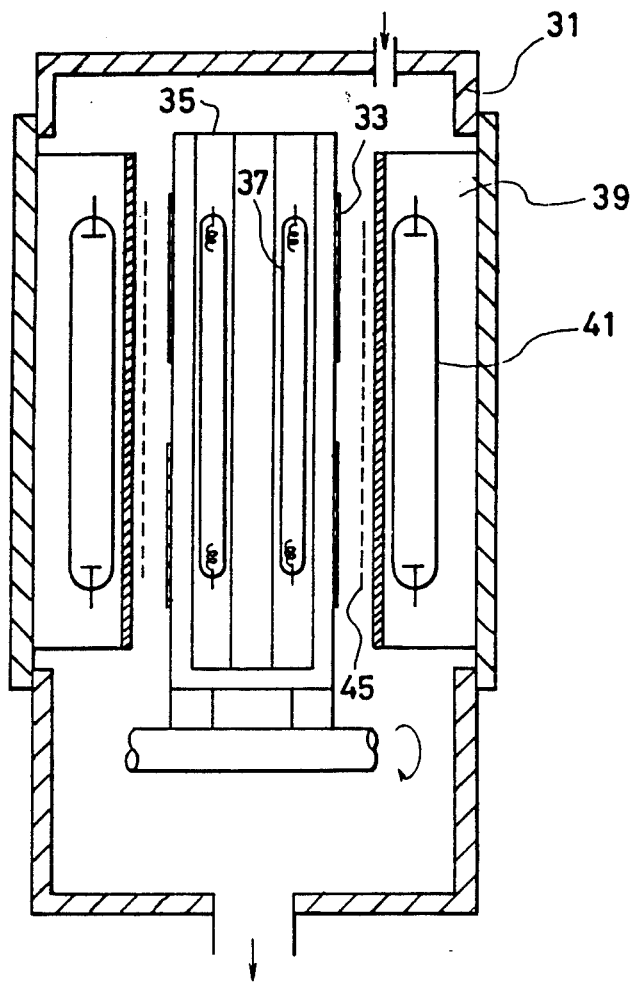
FIG. 1 is a cross section view of an example of a photo CVD apparatus.
Figure 2:
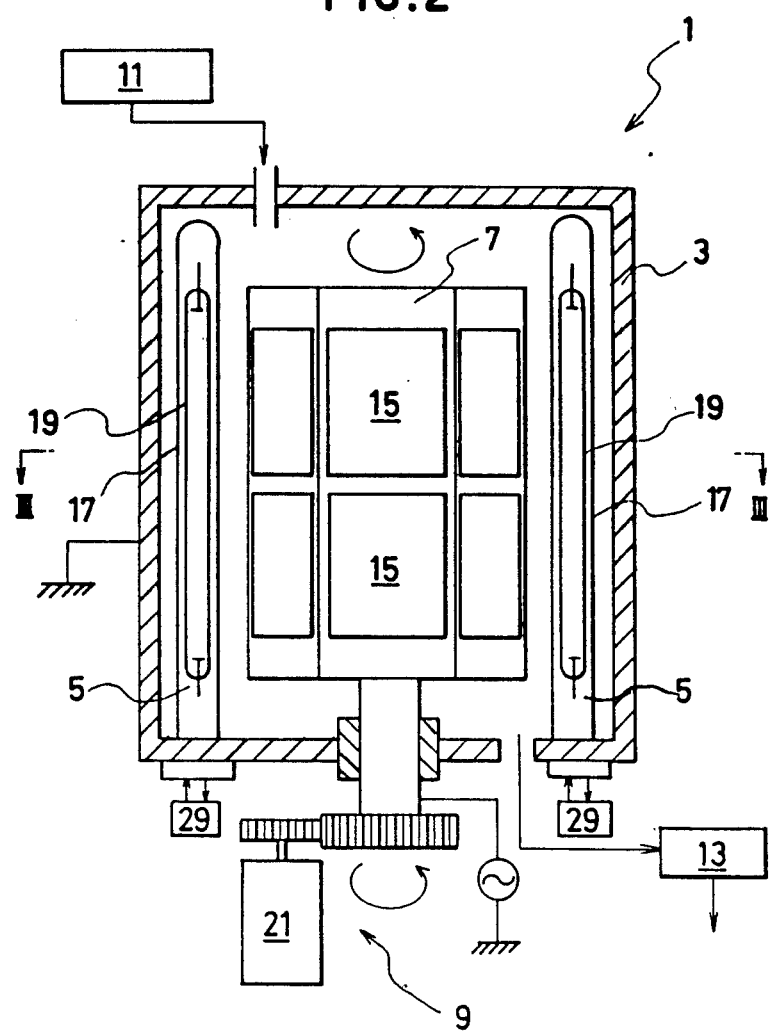
FIG. 2 is a cross section view showing an embodiment of the invention.
Figure 3:
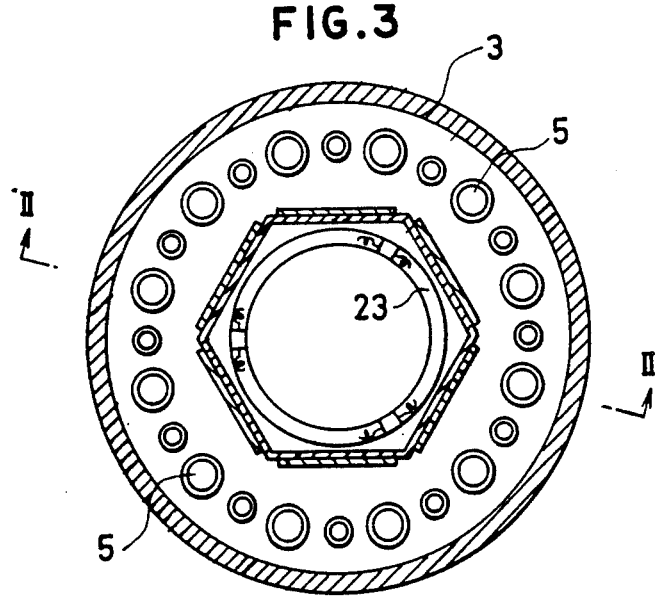
FIG. 3 is a cross section view taken along a III—III line of FIG. 2.

Referring to FIG. 2 and FIG. 3, a photo enhanced CVD apparatus in accordance with the invention is illustrated. In the figure, the apparatus 1 comprises a reaction chamber 3, a hexagonal cart 7 as a substrate holder having six lateral faces on which substrates 15 are mounted, a driving device 9 with a motor 21 for rotating the cart 7 around its axis, a plurality of quartz tubes 17 provided on the inside of the reaction chamber 3 at one ends with a constant angular distance around the cart 7, the other end of the tube being closed, mercury lamps 19 provided in and housed air-tightly by the quartz tube respectively, halogen lamp heaters 24 arranged along the axial direction, a process gas introduction system 11, and an exhaustion system 13. A cooling gas, such as nitrogen gas, is cuiculated in the quartz tubes 19 by means of recirculation means 29. On each face of the cart 7, two substrates each 35 cm long 30 cm wide can be mounted, and therefore the cart 7 can hold twelve substrated thereon. The cart is preferentially removable from the driving device so that substrates can be mounted outside the reaction chamber 3.

Next, the process in the apparatus will be explained. First, twelve substrates are mounted on the cart 7 and entered into the reaction chamber 3. After evacuating the reaction chamber 3 to $10^{-2}$–$10^{-6}$ Torr by means of the exhaustion system 13, a process gas is inputted from the introduction system 11 at about 3 Torr. Simultaneously, the substrates 15 are heated by the heater 23 to about 200° C. Then, the cart 7 encircled by the mercury lamps 19 is rotated at 2 rpm by the driving device 9 and irradiated with ultraviolet light from the lamps 19, whereupon the product of a reaction initiated by optical energy is deposited on the substrates 15. The product undesirably deposited on the quartz tubes 19 can be removed by sputtering in virtue of discharge between the cart 7 and the reaction chamber 3. Photo enhanced CVD process is carried out, e.g., in accordance with the following equation:

$$3Si_2H_6 + 8NH_3 \rightarrow 2Si_3N_4 + 21H_2 \text{ or}$$

$$SiH_4 + 4N_2O \rightarrow SiO_2 + 4N_2 + 2H_2O \quad (1)$$

Figure 4:
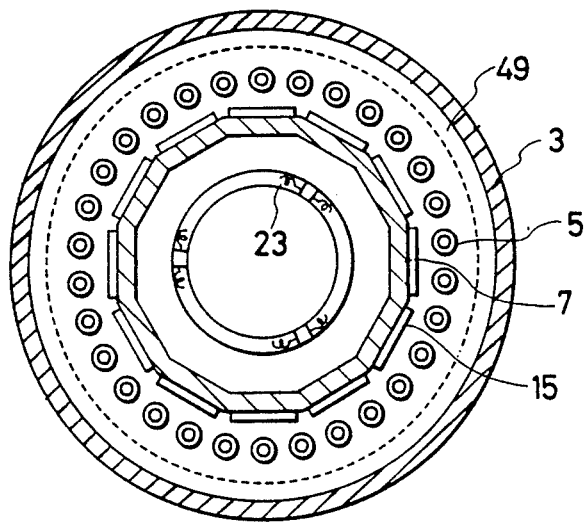
FIG. 4 is a cross section view showing another embodiment of the invention.

Referring now to FIG. 4, another embodiment of the invention is illustrated. This embodiment is same as the preceding embodiment except for the number of side faces of a cart and provision of an electrode 49 in the form of a cylindrical wire net disposed between the cart 7 and the reaction chamber 3. The cart has twelve side faces each capable of holding two substrates. The electrode 49 is used both for generating plasma gas by discharging between itself and the cart 7, and for carrying out etching eliminating unnecessary product deposited on the inside wall of the reaction chamber 3, the external surfaces of the light sources 5 and so forth. The electrode 49 can be placed between the light sources 5 and the cart 7 instead. Plasma CVD may be implemented simultaneously by causing discharge during photo CVD process, or may be implemented after deposition by photo CVD. Plasma CVD is carried out, e.g., using TEOS (tetra-ethyl-oxysilane) in accordance with the following equation:

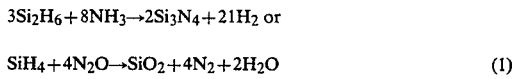

$$SiO_4(C_2H_5)_4 + 28N_2O \rightarrow SiO_2 + 8CO_2 + 10H_2O + 28N_2 \quad (2)$$

After taking out, from the reaction chamber, the substrates on which the deposition has been completed, undesirable deposited product is removed from the inside of the reaction chamber by means of etching in virtue of discharge between the cart 7 and the electrode 49. The etching is carried out, e.g., in accordance with the following equations;

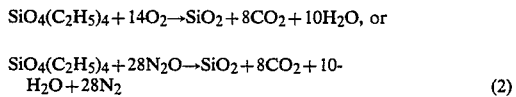

$$3SiO_2 + 4NF_3 \rightarrow 3SiF_4 + 2N_2 + 3O_3$$

Figure 5A:
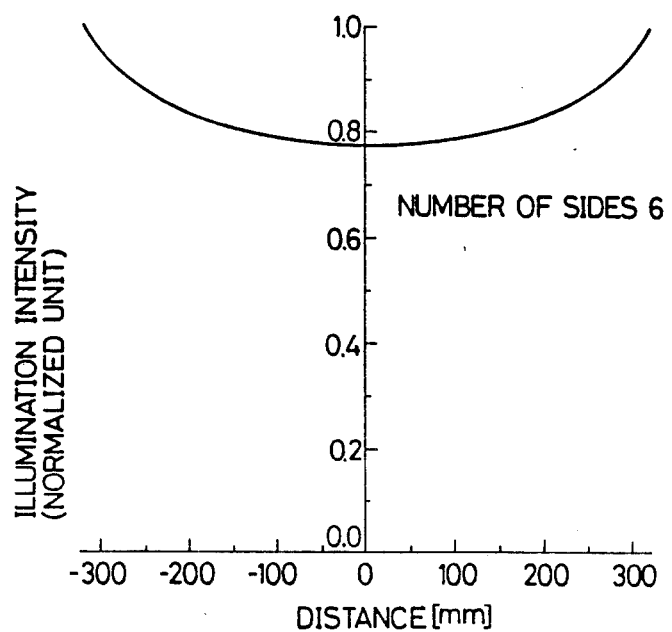
FIGS. 5(A) to 5(C) are graphical diagrams showing the distributions of the intensity on substrates mounted on prism-shaped substrate holder having cross sections of regular polygons of 6, 12, and 24 sides.
Figure 5B:
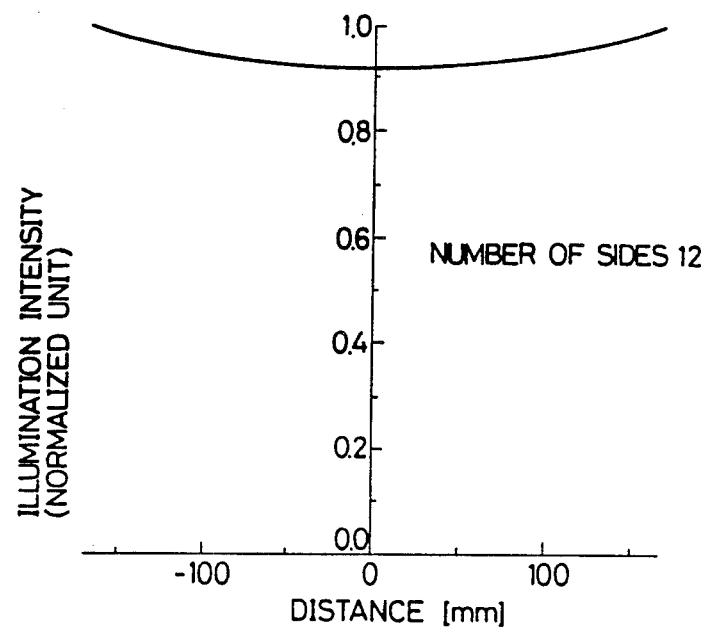
Figure 5C:
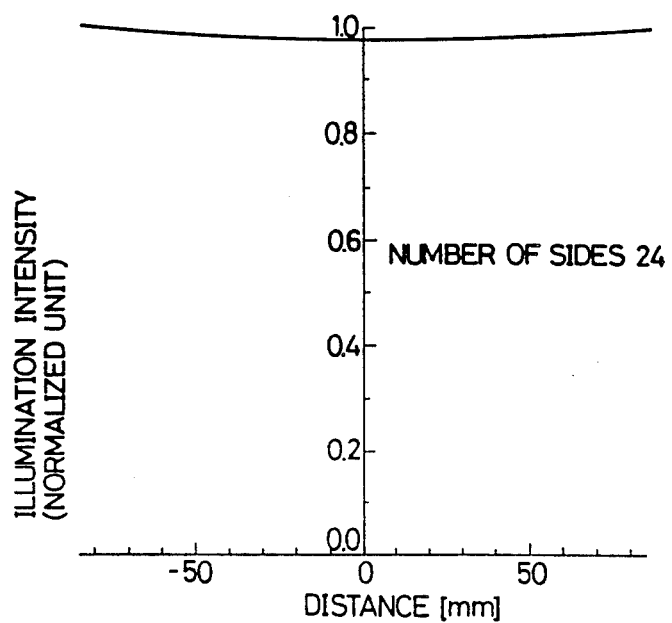

To investigate the relationship between the uniformity of the illumination intensity on the substrate and the number of side faces of the cart, experimental has been made. FIG. 5(A) to 5(C) are graphical diagrams showing the distributions of the intensity on substrates mounted on prism-shaped substrate holders having cross sections of regular polygons of 6, 12, and 24 sides. In the figure, the abscissa is the distance of the measuring point from the center of a substrate, and the ordinate is the intensity normarized with reference to the maximum intensity measured on the substrate. As shown from the diagrams, the distribution of the intensity becomes more unform as the number of the faces increases. Namely, the intensity fluctuates over the irradiated surface at larger than 10% in the case of the cart having six faces, while the fluctuation of the intensity is limited within 5% in the cases of the carts having twelve and twenty-four faces. The cart having twenty-four faces may hold forty-eight substrate by mounting two substrates on each face.

Figure 6A:
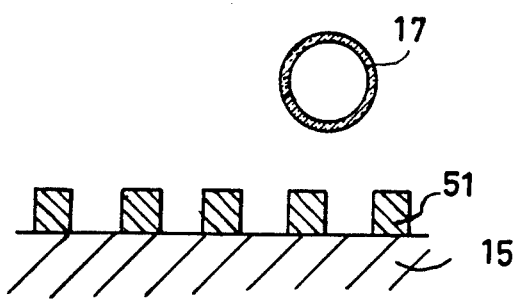
FIGS. 6(A) to 6(C) and FIG. 7 are section views showing the process of an example of CVD in accordance with this invention.
Figure 6B:
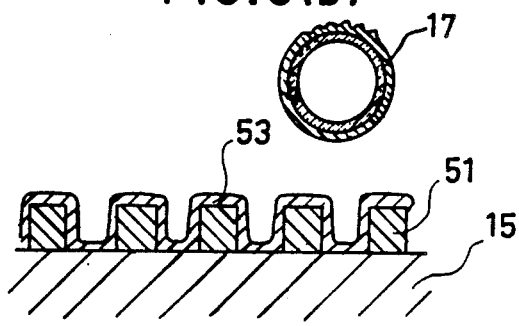
Figure 6C:
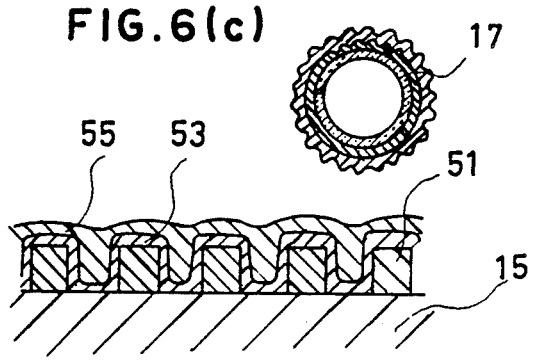
Figure 7:
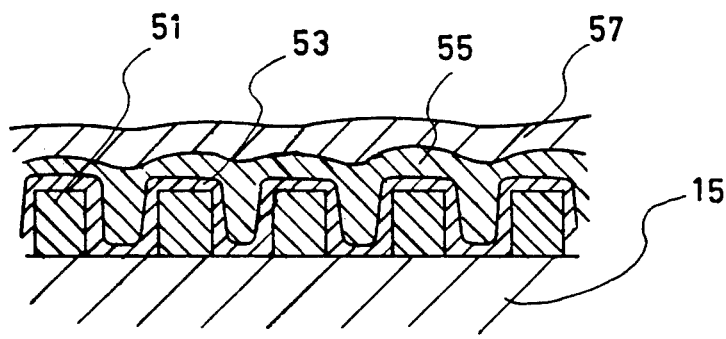

FIGS. 6(A) to 6(C) are cross section views showing an example of CVD process in accordance with the present invention. The surface of a substrate to be coated is provided with a plurality of aluminium lead lines 51. The leads 51 are elongated in the direction perpendicular to the drawing sheet with 0.8 minron in height, 0.6 micron in width and 0.9 micron in interval as shown in FIG. 6(A). A silicon oxide film is deposited on the substrate over the leads 51 by photo CVD in accordance with the equation (1) to the thickness of 0.3 to 0.5 at about 400° C. as shown in FIG. 6(B). Further, another silicon oxide film 55 is deposited by plasma CVD in accordance with the equation (2) at 200° C. as shown in FIG. 6(C). The film 53 is excellent in insulating power due to a comparatively high temperature while the film provides a even upper surfae due to TEOS in liquid state at a comparatively low temperatire. The even upper surface is desirable when provided with an overlying alminium electrode 57 as shown in FIG. 7. The likelihood of disconnection of electrode 57 is reduced by the even surface. After the completion of the depostion, the inside of the reaction chamber is cleaned by etching, e.g., removed is product deposited on the mercury lamp 19, only one being schematically shown in FIGS. 6(A) to 6(C). The etching process can be implemented on the deposited film before or after plasma CVD in order to obtain even surface of the film or to chamfer the edge of the film deposited.

By use of this process, film is deposited with a constant thickness throughout the surface of the substrate 15 in the light of the uniform irradiation over each substrate. However, the uniformity of the thickness can be further improved by modulating the intensity of the mercury lamps 19 in synchronization with the rotation of the cart 7, or by modulating the angular speed of the cart 7 in correspondence with the relative position to the mercury lamps 19. According to the gist of the invention, it is easily understood that the performance of non-photo enhanced plasma CVD is also improved by the use of the rotatable substrate holder.

The invention should not limited to the above particular embodiments and many modifications and variations may cause to those skilled in the art. AS the cross section of the cart 7, other regular or irregular polygons, or circle can be employed. Also the driving device can be provided on the top side of the reaction chamber, or on the lateral side with pinion gear, in place of the bottom side as shown in FIG. 2.

We claim:

1. A method of depositing films on a plurality of substrates by chemical vapor reaction, said method comprising the steps of:

mounting a plurality of substrates on side surfaces of a rotatable polygon substrate holder in a reaction chamber;

depositing a first film on said substrates by a chemical vapor reaction enhanced by light rays emitted from a plurality of light sources which are located surrounding said polygon holder;

removing said substrates from said chamber; and cleaning the external surface of said light source by etching which is carried out by electric discharge between said substrate holder and an electrode located outside of said light source and surrounding said polygon holder.

2. The method of claim 1, further including:

depositing a second film on said first film by a chemical vapor reaction utilizing a plasma reactive gas induced by electric discharge between said substrate holder and said electrode.

3. The method of claim 1, wherein said chemical vapor reaction enhanced by light rays is carried out in accordance with the following equation, $$3Si_2H_6 + 8NH_3 \rightarrow 2Si_3N_4 + 21H_2, \text{ or}$$

$$SiH_4 + 4N_2O \rightarrow SiO_2 + 4N_2 + 2H_2O$$

4. The method of claim 2, wherein said chemical vapor reaction utilizing a plasma is carried out in accordance with the following equation:

$$SiO_4(C_2H_5)_4 + 14O_2 \rightarrow SiO_2 + 8CO_2 + 10H_2O, \text{ or}$$

$$SiO_4(C_2H_5)_4 + 28N_2O \rightarrow SiO_2 + 8CO_2 + 10H_2O + 28N_2$$

5. The method of claim 2, wherein said first film depositing is carried out at a higher temperature than said second film depositing.

6. The method of claim 2, wherein said second film depositing is carried out at a higher temperature than said first film depositing.

* * * * *

UNITED STATES PATENT AND TRADEMARK OFFICE
CERTIFICATE OF CORRECTION

PATENT NO.  : 4,950,624
DATED       : August 21, 1990
INVENTOR(S) : Takashi Inuzima; Shigenori Hayashi; Toru Takayama It is certified that error appears in the above-identified patent and that said Letters Patent is hereby corrected as shown below:

On the title page, item [30], change "61-2118823" to --61-213323--.

Signed and Sealed this

Second Day of May, 1995

Attest:

BRUCE LEHMAN

Attesting Officer    Commissioner of Patents and Trademarks